(12) United States Patent
De Steur et al.

(10) Patent No.: US 6,861,008 B1
(45) Date of Patent: *Mar. 1, 2005

(54) METHOD AND DEVICE FOR LASER DRILLING ORGANIC MATERIALS

(75) Inventors: Hubert De Steur, Drongen (BE); Marcel Heerman, Merelbeke (BE); Jozef Van Puymbroeck, Oostkamp (BE)

(73) Assignee: Siemens Aktiengesellschaft, Munich (DE)

( * ) Notice: Subject to any disclaimer, the term of this patent is extended or adjusted under 35 U.S.C. 154(b) by 244 days.

This patent is subject to a terminal disclaimer.

(21) Appl. No.: 10/089,308

(22) PCT Filed: Sep. 29, 2000

(86) PCT No.: PCT/DE00/03426

§ 371 (c)(1),
(2), (4) Date: Mar. 29, 2002

(87) PCT Pub. No.: WO01/26436

PCT Pub. Date: Apr. 12, 2001

(30) Foreign Application Priority Data

Sep. 30, 1999 (DE) .......... 199 47 040

(51) Int. Cl.⁷ .......... C03C 15/00
(52) U.S. Cl. .......... 216/94; 216/62; 216/65; 216/66
(58) Field of Search .......... 216/27, 39, 52, 216/53, 62, 65, 66, 94; 219/121.71, 121.4, 121.7, 121.67

(56) References Cited

U.S. PATENT DOCUMENTS

| | | | |
|---|---|---|---|
| 4,649,624 A | * 3/1987 | Reedy .......... | 438/59 |
| 4,839,497 A | 6/1989 | Sankar et al. | |
| 5,593,606 A | 1/1997 | Owen et al. | |
| 5,866,644 A | * 2/1999 | Mercx et al. .......... | 524/417 |
| 5,868,950 A | 2/1999 | Noddin | |
| 6,203,952 B1 | * 3/2001 | O'Brien et al. .......... | 430/17 |
| 6,214,916 B1 | * 4/2001 | Mercx et al. .......... | 524/404 |
| 6,713,719 B1 | * 3/2004 | De Steur et al. .......... | 219/121.71 |

FOREIGN PATENT DOCUMENTS

| | | |
|---|---|---|
| DE | 197 19 700 A1 | 11/1998 |
| DE | 198 24 225 A1 | 2/1999 |
| EP | 0 164 564 A1 | 12/1985 |
| EP | 0 478 313 A2 | 4/1992 |
| GB | 2 338 201 A | 12/1999 |

OTHER PUBLICATIONS

T.Rick Fletcher: "Efficient Ablation of an Organic Polymer by a Laser Driven Shock Wave", *Journal of Applied Physics*, Bd. 73 Nr. 10, 15., pp. 5292–5294, May 1993.

Makropoulou M I et al., "Vis and UV Laser Ablation of Polymers", *Spie*, Second GR–1 International Conference on New Laser Technologies and Applications, Olympia, Greece, 1–4, Bd. 3423, 1998., pp. 384–388, Jun. 1997.

"Wirestripping Procedure using Visible Laser Radiation and Dye–Doped Insulation", IBM Technical Disclosure Bulletin, Bd. 34 Nr. 12, 1., p. 378, May 1992.

F. J. Hillebrand, "Laserbohren in Organischem Leiterplatten–Material", Feinwerktechnik & Messtechnik, vol. 91 Marz, No. 2, Munchen, Deutschland, pp. 56–58, 1983.

* cited by examiner

Primary Examiner—Lan Vinh
(74) Attorney, Agent, or Firm—Harness, Dickey & Pierce, P.L.C.

(57) ABSTRACT

For the laser drilling of organic materials, in particular for making blind holes in dielectric layers, a frequency-doubled Nd-vanadate laser with the following parameters is used:

| | |
|---|---|
| pulse width | <40 ns |
| pulse frequency | ≧20 kHz |
| wavelength | =532 nm. |

36 Claims, No Drawings

METHOD AND DEVICE FOR LASER DRILLING ORGANIC MATERIALS

This application is the national phase under 35 U.S.C. § 371 of PCT International Application No. PCT/DE00/03426 which has an International filing date of Sep. 29, 2000, which designated the United States of America, the entire contents of which are hereby incorporated by reference.

FIELD OF THE INVENTION

The invention generally relates to laser drilling.

BACKGROUND OF THE INVENTION

It is known from EP-A-0 164 564 to use an excimer laser to produce blind holes in a laminate with the layer sequence metal-dielectric-metal. The uppermost metal layer of the laminate is in this case used as an aperture mask, the pattern of holes of which is transferred by means of photolithography and is produced by subsequent etching. The dielectric exposed in the region of the apertures of this mask is then removed by the action of the excimer laser until the lowermost metal layer is reached and the removal process is ended. The known method is used in particular in the manufacture of multilayer printed circuit boards for producing the required plated-through holes in the form of blind holes.

The German periodical "Feinwerktechnik & Messtechnik 91 (1983) 2, pages 56–58, discloses a similar method of manufacturing multilayer printed circuit boards, in which the blind holes serving as plated-through vias are produced with the aid of a $CO_2$ laser. Here, too, the uppermost copper foil serves as an aperture mask, with which the copper is etched away whereever the laser beam is intended to produce a hole.

DE-A-197 19 700 also already discloses devices for the laser drilling of laminates, in which a first laser with a wavelength in the range from approximately 266 nm to 1064 nm is used for drilling the metal layers and a second laser with a wavelength in the range from approximately 1064 nm to 10600 nm is used for drilling the dielectric layers.

U.S. Pat. No. 5,593,606 discloses a method for the laser drilling of laminates in which a single UV laser, the wavelength of which lies below 400 nm and the pulse widths of which lie below 100 ns, is used for drilling the metal layers and for drilling the dielectric layers. Precluding the use an excimer laser, metal and organic material are consequently drilled with the same UV laser.

DE-A-198 24 225 discloses a further method for the laser drilling of laminates, in which for example an SHG (second harmonic generation) YAG laser with a wavelength of 532 nm or a THG (third harmonic generation) YAG laser with a wavelength of 355 nm can also be used for drilling the metal layers and for drilling the dielectric layers.

In principle, it can be stated that, in the laser drilling of organic materials with UV lasers, that is to say with wavelengths below 400 nm, a photochemical decomposition of the organic materials takes place. Consequently, no burning occurs and, on account of the extremely small or non-existent thermal loading, in the case of laminates no delamination occurs. By contrast with this, in the laser drilling of organic materials with $CO_2$ lasers, a thermal decomposition of the organic materials takes place, that is to say burning may occur and, in the case of laminates, there is the risk of delamination. In comparison with UV lasers, however, considerably shorter machining times can be achieved with $CO_2$ lasers in the drilling of organic materials.

EP-A-0 478 313 discloses the so-called SLC (Surface Laminar Circuit) method, in which initially a first wiring level is produced on a base substrate. Then, a dielectric layer of a photosensitive epoxy resin is applied to this first wiring level by screen printing or by curtain coating. Then, blind holes are produced in the dielectric layer by photolithographic means, by exposing and developing. After the chemical and electrolytic copper-plating of the walls of the holes and the surface of the dielectric layer, the second wiring level is produced by structuring of the deposited copper layer. Further wiring levels can be produced in the way described by the alternating application of photosensitive dielectric layers and copper layers.

SUMMARY OF THE INVENTION

An embodiment of the present invention is based on the problem of permitting rapid production of blind holes or through-holes without thermally damaging the material in the laser drilling of organic materials.

An embodiment of the invention is based on the finding that, with frequency-doubled Nd-vanadate lasers with a wavelength of 532 nm and short pulse widths of below 40 ns, layers of organic material can be machined with short machining times and without the risk of burning. In this case, pulse frequencies of $\geq 20$ kHz are chosen for the laser drilling of the organic material. In the laser machining of the organic materials there is a combination of photochemical and thermal decomposition, which in comparison with UV lasers permits shorter machining times and in comparison with $CO_2$ lasers avoids excessive thermal loads. It can be regarded as a further advantage that, with the same Nd-vanadate laser, metal layers of laminates can also be drilled. For the drilling of metal layers of this type, pulse frequencies of $\geq 30$ kHz are then chosen.

The frequency-doubled ND-vanadate laser selected according to an embodiment of the invention for the drilling of organic materials permits very high pulse frequencies, which may even lie above 100 kHz, with low pulse widths of less than 40 ns. The high pulse frequencies in this case permit fast and effective machining of the organic materials, while very low thermal loading is ensured by the low pulse widths. With other lasers which operate with similar or the same wavelengths, a combination of this type, with high pulse frequencies and short pulse widths, cannot be realized. For example, in the case of the SHG-YAG laser known from DE-A-198 24 225, at higher pulse frequencies it is only possible to achieve at most pulse widths of 70 to 80 ns.

An embodiment further can permit, by laser widths of less than 30 ns, a still lower thermal loading of the organic materials or, if appropriate, of the laminates during the laser drilling.

Using a focused laser beam with a spot diameter of between 10 µm and 100 µm can provide effective laser machining of the organic materials. Using spot diameters of between 20 µm and 50 µm can allow the laser machining of the organic materials to be made even more effective.

An embodiment further can permit a considerable increase in the machining rate by the higher absorption of the laser beams in the organic material. The additives are in this case to have a significantly higher degree of absorption for laser beams with a wavelength of 532 nm than the pure organic material.

A development can permit a particularly simple and cost-effective increase in the degree of absorption of the organic material.

A refinement can further permit an optimization of the degree of absorption by the selection of red additives, since the green light of the wavelength of 532 nm is absorbed particularly well by the complementary color red.

A development can specify a quantity range for the admixture of pigments as additive which has proven to be particularly successful for increasing the degree of absorption without impairing the other properties. A narrower range can be regarded as optimum in this respect.

If the degree of absorption of the organic material is increased to at least 50% by the admixture of additives a considerable increase in the machining rate in the organic material is already obtained. With an increase in the degree of absorption to at least 60%, or to at least 80%, the machining times for the laser drilling of the organic material can be reduced correspondingly further.

DETAILED DESCRIPTION OF THE PREFERRED EMBODIMENTS

In the examples described below, the following types of laser were used:

Laser I:

Diode-pumped, frequency-doubled Nd-vanadate laser from the company Spectra Physics, Mountain View, Calif., US.

| | |
|---|---|
| Designation: | T80-YHP40-532QW |
| Wavelength: | 532 nm |
| Power: | approximately 8.5 W |
| Operating mode: | monomode TEMoo |
| Pulse width: | 20 ns at pulse frequency of 10 kHz |
| Pulse frequency: | up to 200 kHz |
| Field size: | 100 × 100 mm². |

Laser II:

Diode-pumped, frequency-doubled Nd-vanadate laser from the company Haas-Laser GmbH, Schramberg, DE.

| | |
|---|---|
| Designation: | none, since prototype |
| Wavelength: | 532 nm |
| Power: | approximately 4.0 W |
| Operating mode: | monomode TEMoo |
| Pulse width: | 25 ns at pulse frequency of 10 kHz |
| Pulse frequency: | up to 200 kHz |
| Field size: | 100 × 100 mm². |

Example 1

In the manufacture of multilayer wirings, dielectric layers of an organic material are applied in a thickness of, for example, 25 μm to the already finished wiring layers by curtain coating or by screen printing. An epoxy material is used, for example, as the organic material. Then blind holes, later serving as plated-through vias to the next wiring layers, are made in these dielectric layers without the use of masks.

For making blind holes in the dielectric layers, the laser II was used. Using two galvanometer mirrors for deflecting the laser beam, a surface area of 10 cm×10 cm can be machined. Further parameters of the laser are specified as follows:

| | |
|---|---|
| Pulse width: | 30 ns |
| Pulse frequency: | 25 kHz |

With a spot diameter of the focused laser beam of approximately 25 μm, the blind holes were made in the dielectric layer at the predetermined locations. A pulse frequency of between 10 and 20 kHz was chosen for this. When making the blind holes, it was possible to avoid burning or other thermal damage.

Example 2

With the laser I, blind holes with a diameter of 125 μm were made in the epoxy material of an RCC material (RCC=Resin Coated Copper Foil). The RCC material comprised a 12 μM thick copper foil and a 60 μm thick dielectric layer of epoxy material. The pulse frequency was 25 kHz. The pulse length was 30 ns.

Using two galvanometer mirrors for deflecting the laser beam in the X direction and in the Y direction, a surface area of 10 cm×10 cm was machined. For drilling the epoxy material, the laser beam was set 1.6 mm out of focus (OOF=Out Of Focus) and moved in concentric circles in the region of the hole. The linear velocity of the laser beam was 900 mm/s. After drilling through the epoxy material, the copper layer lying underneath was affected only slightly.

The drilling of the epoxy material took place at a rate of 220 holes per second.

Example 3

As a departure from example 2, the laser II was used, with the same laser parameters. The drilling of the epoxy material took place at a rate of 122 holes per second.

Example 4

As a departure from example 2, the blind holes were made in a 60 μm thick FR4 material (FR4=level 4 fire retardant epoxy-glass composition), onto which a 12 μm thick copper foil had been laminated on one side. The results were comparable.

Example 5

As a departure from example 3, the blind holes were made in a 60 μm thick FR4 material, onto which a 12 μm thick copper foil had been laminated on one side. The results were comparable.

Example 6

As a departure from example 2, blind holes with a diameter of 100 μm were produced. The drilling of the epoxy material took place here at a rate of 382 holes per second.

Example 7

As a departure from example 3, blind holes with a diameter of 100 μm were produced. The drilling of the epoxy material took place here at a rate of 212 holes per second.

Example 8

As a departure from example 2, blind holes with a diameter of 75 μm were produced. The drilling of the epoxy material took place here at a rate of 800 holes per second.

Example 9

As a departure from example 3, blind holes with a diameter of 75 μm were produced. The drilling of the epoxy material took place here at a rate of 400 holes per second.

Example 10

As a departure from example 2, a modified epoxy material to which approximately 1.5% by weight of additive was admixed was used. The additive was an organic red pigment with the designation "1501 Fast Red" (C.I. Pigment Red 48:1) from the company Xijingming, Shenzhou City, Hebei Province, P.R. China. This pigment is an azo pigment based on a barium salt. The improved absorption of the laser radiation allowed the rate for drilling the epoxy material to be increased to 550 holes per second.

Example 11

As a departure from example 10, an inorganic red pigment with the designation "Bayferrox™" (C.I. Pigment Rot) from Bayer AG, DE was used as the additive. This pigment is an iron oxide red pigment. The results were comparable.

Example 12

As a departure from example 10, a polymer-soluble anthraquinone dye with the designation "Oracet™" Gelb GHS(C.I. Solvent Gelb 163) from CIBA-GEIGY AG, CH was used as the additive. The increase in the rate for drilling the epoxy material was somewhat smaller here.

Example 13

As a departure from example 10, the laser II was used, with the same laser parameters. It was possible to increase the rate for drilling the epoxy material to 306 holes per second.

Example 14

As a departure from example 10, blind holes with a diameter of 100 μm were produced. The rate for drilling the epoxy material was 956 holes per second.

Example 15

As a departure from example 13, blind holes with a diameter of 100 μm were produced. The rate for drilling the epoxy material was 531 holes per second.

Example 16

As a departure from example 4, a modified FR4 material was used, in which, instead of the customary glass fiber reinforcement, the epoxy material was reinforced with approximately 50% by weight of fibers of a ruby glass. This ruby glass was prepared by adding 2% by weight of selenium, 1% by weight of arsenic trioxide and 0.5% by weight of carbon to a basic glass of the composition $Na_2O$—$ZnO$—$4SIO_2$.

It was possible to increase the rate for drilling this glass-reinforced epoxy material by a factor of between 2 and 2.5.

The invention being thus described, it will be obvious that the same may be varied in many ways. Such variations are not to be regarded as a departure from the spirit and scope of the invention, and all such modifications as would be obvious to one skilled in the art are

What is claimed is:

1. A method for laser drilling of organic materials, comprising:

using a frequency-doubled Nd-vanadate laser for the laser drilling, wherein the laser includes the following laser parameters,

| | |
|---|---|
| pulse width | <40 ns, |
| pulse frequency | ≧20 kHz, and |
| wavelength | =532 nm. |

2. The method as claimed in claim 1, wherein a laser pulse width of <30 ns is used.

3. The method as claimed in claim 1, wherein a focused laser beam with a spot diameter of between 10 μm and 100 μm is used.

4. The method as claimed in claim 3, wherein a focused laser beam with a spot diameter of between 20 μm and 40 μm is used.

5. The method as claimed in claim 1, wherein additives which absorb laser beams with a wavelength of 532 nm are admixed with the organic material.

6. The method as claimed in claim 5, wherein at least one of an inorganic pigment, an organic pigment, at least one polymer-soluble dye and at least one fibrous filler is used as the additive.

7. The method as claimed in claim 6, wherein at least one of an inorganic red pigment and one organic red pigment and one polymer-soluble red dye is used as the additive.

8. The method as claimed in claim 6, wherein between 0.1% by weight and 5.0% by weight of pigments are admixed with the organic material.

9. The method as claimed in claim 6, wherein between 1% by weight and 2% by weight of pigments are admixed with the organic material.

10. The method as claimed in claim 5, wherein the organic material has, as a result of the admixing of the additives, a degree of absorption of at least 50% for the wavelength 532 nm of the laser radiation.

11. The method as claimed in claim 5, wherein the organic material has, as a result of the admixing of the additives, a degree of absorption of at least 60% for the wavelength 532 nm of the laser radiation.

12. The method as claimed in claim 5, wherein the organic material has, as a result of the admixing of the additives, a degree of absorption of at least 80% for the wavelength 532 nm of the laser radiation.

13. A device for the laser drilling of organic materials, comprising:

a frequency-doubled Nd-vanadate laser with the following laser parameters,

| | |
|---|---|
| pulse width | <40 ns, |
| pulse frequency | ≧20 kHz, and |
| wavelength | =532 nm. |

14. The method as claimed in claim 2, wherein a focused laser beam with a spot diameter of between 10 μm and 100 μm is used.

15. The method as claimed in claim 14, wherein a focused laser beam with a spot diameter of between 20 μm and 40 μm is used.

16. The method as claimed in claim 7, wherein between 0.1% by weight and 5.0% by weight of pigments are admixed with the organic material.

17. The method as claimed in claim 7, wherein between 1% by weight and 2% by weight of pigments are admixed with the organic material.

18. The method as claimed in claim 6, wherein the organic material has, as a result of the admixing of the additives, a degree of absorption of at least 50% for the wavelength 532 nm of the laser radiation.

19. The method as claimed in claim 7, wherein the organic material has, as a result of the admixing of the additives, a degree of absorption of at least 50% for the wavelength 532 nm of the laser radiation.

20. The method as claimed in claim 8, wherein the organic material has, as a result of the admixing of the additives, a degree of absorption of at least 50% for the wavelength 532 nm of the laser radiation.

21. The method as claimed in claim 9, wherein the organic material has, as a result of the admixing of the additives, a degree of absorption of at least 50% for the wavelength 532 nm of the laser radiation.

22. The method as claimed in claim 6, wherein the organic material has, as a result of the admixing of the additives, a degree of absorption of at least 60% for the wavelength 532 nm of the laser radiation.

23. The method as claimed in claim 7, wherein the organic material has, as a result of the admixing of the additives, a degree of absorption of at least 60% for the wavelength 532 mm of the laser radiation.

24. The method as claimed in claim 8, wherein the organic material has, as a result of the admixing of the additives, a degree of absorption of at least 60% for the wavelength 532 nm of the laser radiation.

25. The method as claimed in claim 9, wherein the organic material has, as a result of the admixing of the additives, a degree of absorption of at least 60% for the wavelength 532 nm of the laser radiation.

26. The method as claimed in claim 6, wherein the organic material has, as a result of the admixing of the additives, a degree of absorption of at least 80% for the wavelength 532 nm of the laser radiation.

27. The method as claimed in claim 7, wherein the organic material has, as a result of the admixing of the additives, a degree of absorption of at least 80% for the wavelength 532 nm of the laser radiation.

28. The method as claimed in claim 8, wherein the organic material has, as a result of the admixing of the additives, a degree of absorption of at least 80% for the wavelength 532 nm of the laser radiation.

29. The method as claimed in claim 9, wherein the organic material has, as a result of the admixing of the additives, a degree of absorption of at least 80% for the wavelength 532 nm of the laser radiation.

30. A method for laser drilling of metallic materials, comprising:

using a frequency doubled Nd-vanadate laser for the laser drilling, wherein the laser includes the following laser parameters:

pulse width < 40 ns,
pulse frequency ≧ 30 kHz, and
wavelength = 532 nm.

31. The method as claimed in claim 30, wherein a laser pulse width of less than 30 ns is used.

32. The method as claimed in claim 30, wherein a focused laser beam with a spot diameter of between 10 $\mu$m and 100 $\mu$m is used.

33. The method as claimed in claim 32, wherein a focused laser beam with a spot diameter with 20 $\mu$m and 40 $\mu$m is used.

34. A device for the laser drilling of metallic materials comprising:

a frequency doubled Nd-vanadate laser with the following laser parameters:

pulse width < 40 ns.
pulse frequency ≧ 30 kHz, and
wavelength = 532 nm.

35. The method as claimed in claim 34, wherein a focused laser beam with a spot diameter of between 10 $\mu$m and 100 $\mu$m is used.

36. The method as claimed in claim 35, wherein a focused laser beam with a spot diameter with 20 $\mu$m and 40 $\mu$m is used.

* * * * *